United States Patent
Bialas, Jr. et al.

(10) Patent No.: US 9,620,184 B1
(45) Date of Patent: Apr. 11, 2017

(54) EFFICIENT CALIBRATION OF MEMORY DEVICES

(71) Applicant: International Business Machines Corporation, Armonk, NY (US)

(72) Inventors: John S. Bialas, Jr., South Burlington, VT (US); David D. Cadigan, Poughkeepsie, NY (US); Stephen P. Glancy, Poughkeepsie, NY (US); Warren E. Maule, Cedar Park, TX (US); Gary A. Van Huben, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/970,798

(22) Filed: Dec. 16, 2015

(51) Int. Cl.
  *G11C 5/14* (2006.01)
  *G11C 7/22* (2006.01)
  *G11C 29/02* (2006.01)

(52) U.S. Cl.
  CPC .............. *G11C 7/22* (2013.01); *G11C 29/025* (2013.01)

(58) Field of Classification Search
  CPC .................................. G11C 7/22; G11C 29/025
  USPC .......... 365/189.09, 193, 129, 189.011, 210.1
  See application file for complete search history.

(56) References Cited

U.S. PATENT DOCUMENTS

| | | | |
|---|---|---|---|
| 7,036,053 B2 | 4/2006 | Zumkehr et al. | |
| 8,037,375 B2 | 10/2011 | Schaefer | |
| 8,850,155 B2 | 9/2014 | Brandl et al. | |
| 8,918,686 B2 | 12/2014 | Lai et al. | |
| 8,923,382 B2 * | 12/2014 | Ito .......................... | H04L 27/01 375/233 |
| 9,401,721 B1 * | 7/2016 | Barakat ................ | G11C 7/1084 |
| 2006/0181303 A1 * | 8/2006 | Dreps ................. | G06F 13/4072 326/29 |
| 2010/0332921 A1 | 12/2010 | Schaefer | |
| 2011/0141827 A1 | 6/2011 | Mozak et al. | |
| 2013/0155788 A1 | 6/2013 | Brandl et al. | |
| 2015/0095565 A1 | 4/2015 | Morris et al. | |
| 2016/0292094 A1 * | 10/2016 | Jeter ................... | G06F 13/1668 |

OTHER PUBLICATIONS

Bialas, Jr. et al., "Efficient Calibration of Memory Devices" U.S. Appl. No. 14/955,183, filed Dec. 1, 2015.
(Continued)

*Primary Examiner* — Fernando Hidalgo
(74) *Attorney, Agent, or Firm* — Martin & Associates, LLC; Bret J. Petersen

(57) ABSTRACT

A system and method for efficient data eye training reduces the time and resources spent calibrating one or more memory devices. A reference voltage (Vref) calibration mechanism reduces the time and resources for calibration by reducing the number of tests needed to sufficiently determine the boundaries of the data eye of the memory device by using a combination of small steps and small steps to find a preferred reference voltage. In one example, the Vref calibration mechanism uses small steps of the reference voltage in a first range above a nominal reference voltage to find a maximum eye width then uses small steps to more precisely find the maximum eye width. If a maximum reference voltage is found in the first range then the second range below the nominal reference voltage does not need to be tested thereby saving additional time and resources.

19 Claims, 7 Drawing Sheets

(56) References Cited

OTHER PUBLICATIONS

Appendix P—List of IBM Patents or Patent Applications Treated as Related.
Bialas, Jr. et al., "Efficient Calibration of Memory Devices" U.S. Appl. No. 15/044,746, filed Feb. 16, 2016.
Bialas, Jr. et al., "Efficient Calibration of Memory Devices" U.S. Appl. No. 15/044,832, filed Feb. 16, 2016.

* cited by examiner

EFFICIENT CALIBRATION OF MEMORY DEVICES

BACKGROUND

1. Technical Field

This disclosure generally relates to digital memory devices or circuits, and more specifically relates to efficient data eye calibration of memory devices such as double data rate (DDR) memory.

2. Background Art

High speed data links are often used to interface between a memory controller and a double data rate (DDR) synchronous dynamic random access memory (SDRAM) device. A DDR SDRAM interface may receive aligned data (DQ) and read data strobe (DQS) signals from a DDR SDRAM device for transfer to a memory controller. The DDR SDRAM interface or memory controller is responsible for providing the appropriate DQ-DQS timing relationship to provide, for example, an adequate setup and hold time margin within a data valid window. Various methods have been developed for calibrating a data valid window to maintain the read data strobe (DQS) substantially in the center of a defined data valid window for DDR memory applications. Data calibration was first done in the time domain. Subsequently, data calibration has been done in two dimensions that include the time domain and reference voltage (Vref) training. Calibrating the data valid window is sometimes called data "eye" training.

DDR memory calibration or data eye training may be performed at system boot by a basic input/output system (BIOS), a unified extensible firmware interface (UEFI), or a memory controller. Data eye training may be used to place a memory data strobe within the data eye for a given memory cycle. By performing a two-dimensional analysis, it is possible to adjust and/or select the operating Vref(s) for a DDR memory by making tradeoffs between optimized timing and Vref voltage margins. Data eye training may occur on a DRAM by DRAM basis, on a rank by rank basis, on a channel by channel basis, or across all byte lanes.

BRIEF SUMMARY

The disclosure and claims herein provide an efficient system and method for data eye training that reduces the time and resources spent calibrating one or more memory devices. A reference voltage (Vref) calibration mechanism reduces the time and resources for calibration by reducing the number of tests needed to sufficiently determine the boundaries of the data eye of the memory device by using a combination of small steps and small steps to find a preferred reference voltage. In one example, the Vref calibration mechanism uses big steps of the reference voltage in a first range above a nominal reference voltage to find a maximum eye width then uses small steps to more precisely find the maximum eye width. If a maximum reference voltage is found in the first range then the second range below the nominal reference voltage does not need to be tested thereby saving additional time and resources.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

Figure 7:
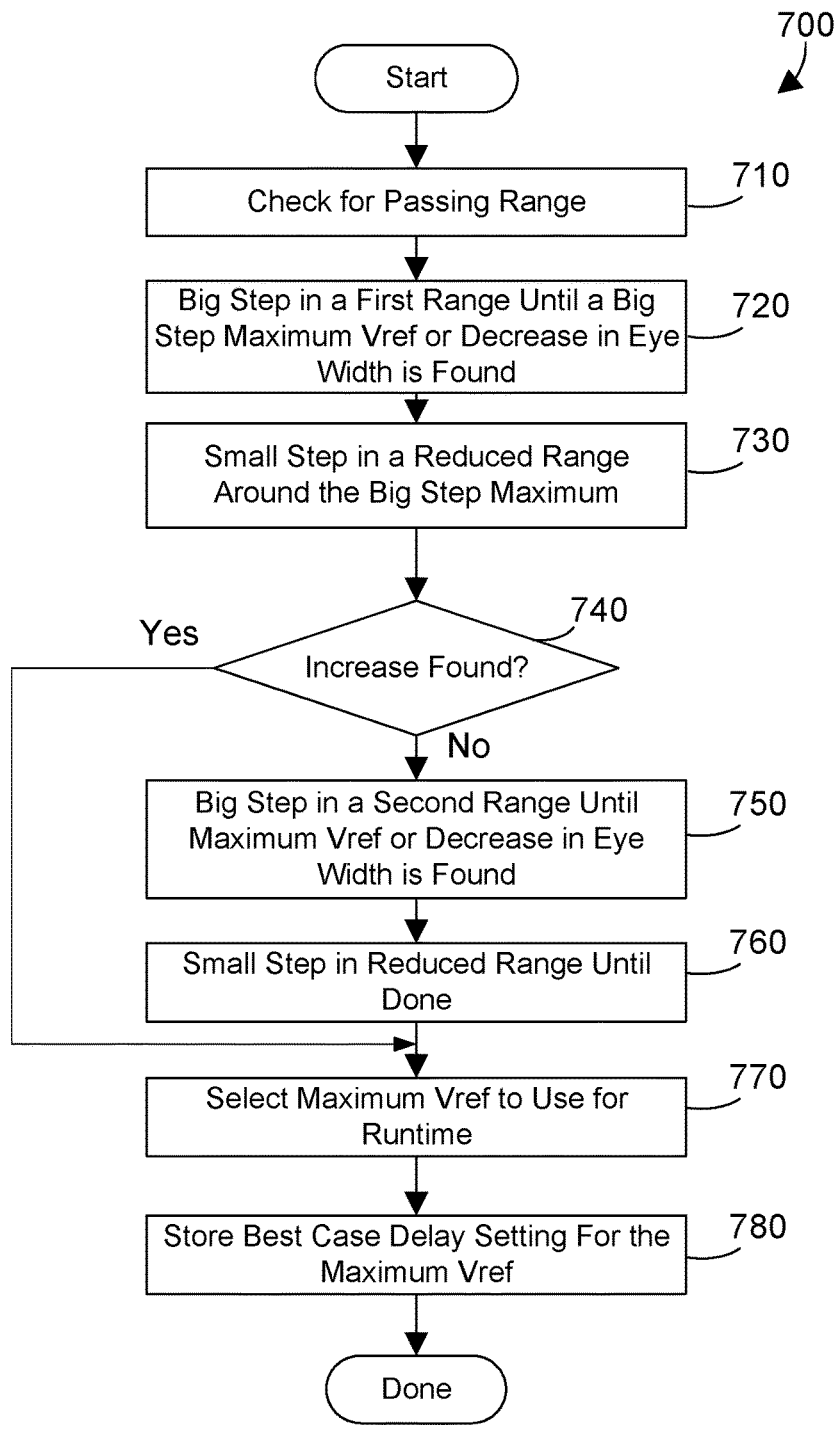
FIG. 7 is another flow diagram of a method for a system for a Vref calibration mechanism to calibrate a memory device.
Figure 8:
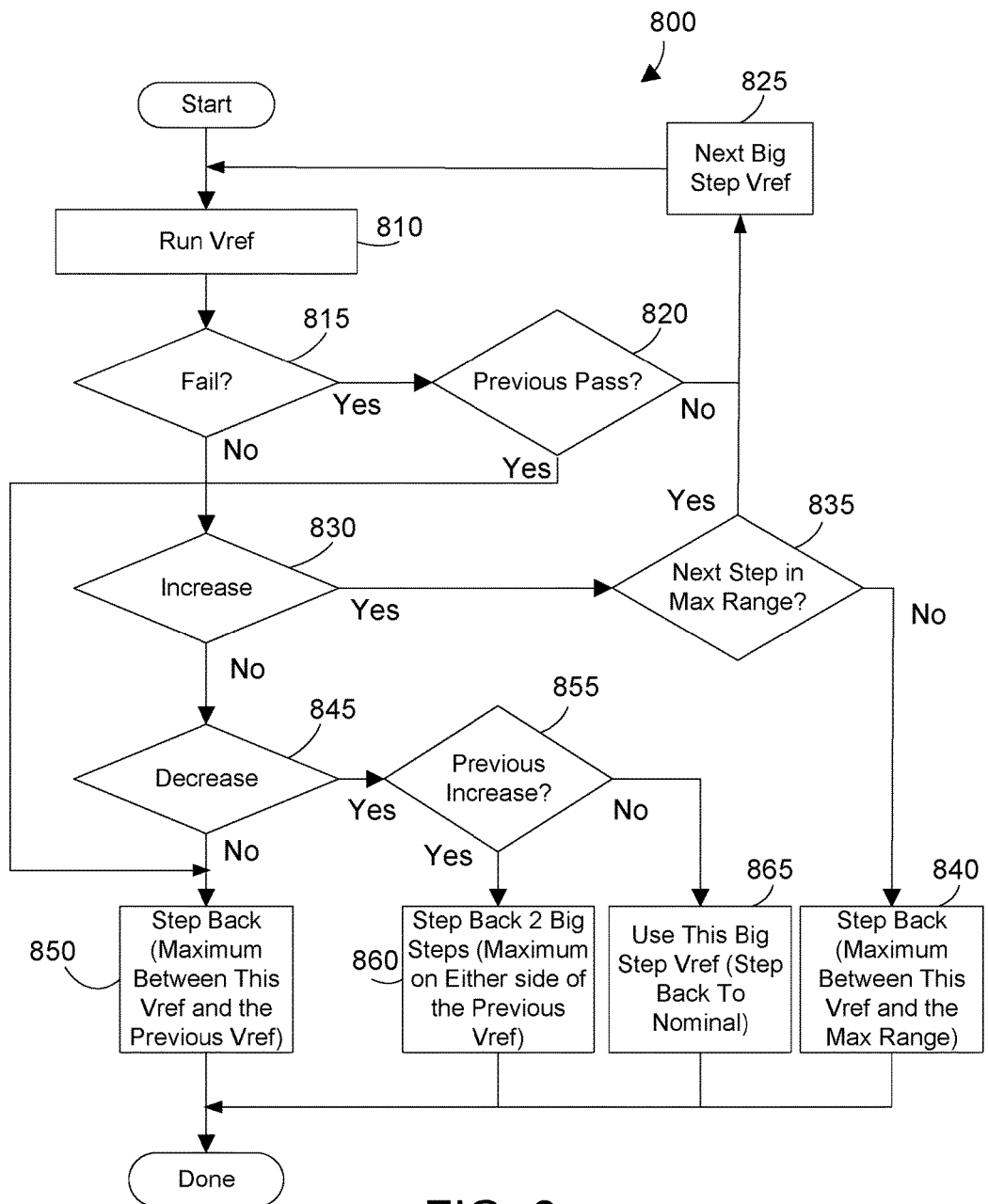
Figure 9:
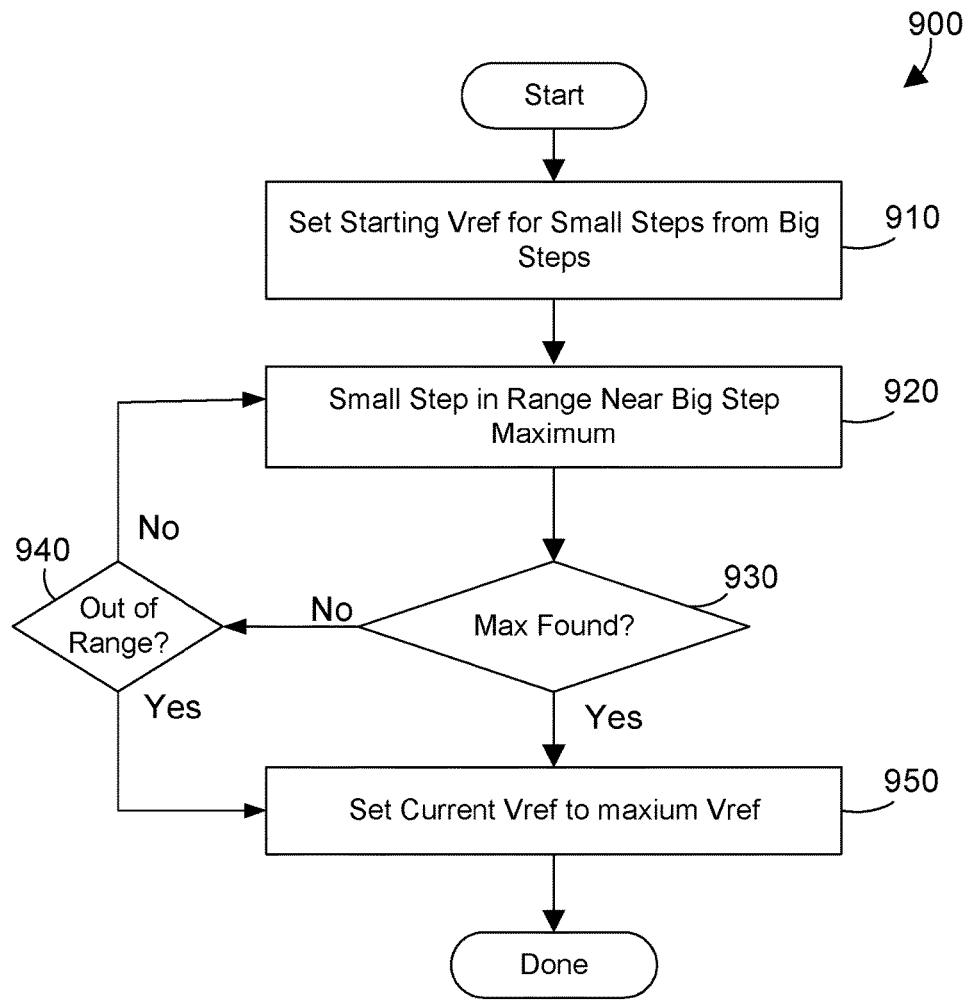

FIG. 8 is a flow diagram of a specific method for steps 720 and 750 in FIG. 7; and FIG. 9 is a flow diagram of a specific method for steps 730 and 760 in FIG. 7.

DETAILED DESCRIPTION

The disclosure and claims herein relate to an efficient system and method for data eye training that reduces the time and resources spent calibrating one or more memory devices. A reference voltage (Vref) calibration mechanism reduces the time and resources for calibration by reducing the number of tests needed to sufficiently determine the boundaries of the data eye of the memory device by using a combination of small steps and small steps to find a preferred reference voltage. In one example, the Vref calibration mechanism uses big steps of the reference voltage in a first range above a nominal reference voltage to find a maximum eye width then uses small steps to more precisely find the maximum eye width. If a maximum reference voltage is found in the first range then the second range below the nominal reference voltage does not need to be tested thereby saving additional time and resources.

Figure 1:
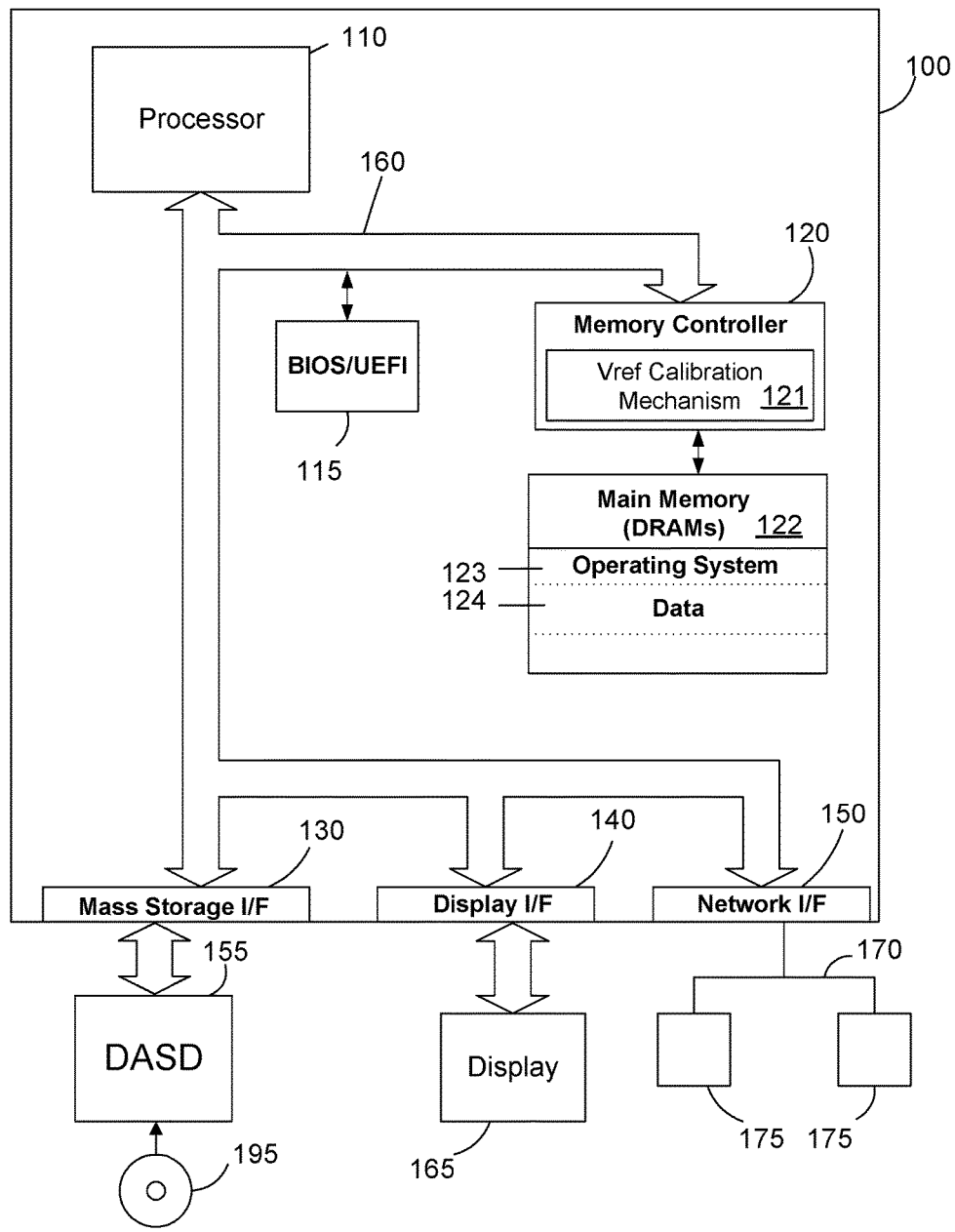
FIG. 1 is a block diagram a computer system with a Vref calibration mechanism described herein.

Referring to FIG. 1, a computer system 100 is one suitable implementation of a computer system that includes a system for data eye training that reduces the time and resources spent calibrating memory devices as described herein. Computer system 100 is a computer which can run multiple operating systems including the IBM i operating system. However, those skilled in the art will appreciate that the disclosure herein applies equally to any computer system, regardless of whether the computer system is a complicated multi-user computing apparatus, a single user workstation, laptop, phone or an embedded control system. As shown in FIG. 1, computer system 100 comprises one or more processors 110, a basic input/output system (BIOS) and/or unified extensible firmware interface (UEFI) 115, a memory controller 120, a main memory 122, a mass storage interface 130, a display interface 140, and a network interface 150. These system components are interconnected through the use of a system bus 160. Mass storage interface 130 is used to connect mass storage devices with a computer readable medium, such as direct access storage devices 155, to computer system 100. One specific type of direct access storage device 155 is a readable and writable CD-RW drive, which may store data to and read data from a CD-RW 195. Some devices may have a removable memory card or similar for a direct access storage device 155 instead of the CD-RW drive.

Main memory 122 preferably contains an operating system 123. Operating system 123 is a multitasking operating system known in the industry as IBM i; however, those skilled in the art will appreciate that the spirit and scope of this disclosure is not limited to any one operating system. The memory further includes data 124. The Vref calibration mechanism 121 shown in the memory controller 120 may alternatively be physically located in the memory 122 and executed by the processor 110. Alternatively, the Vref calibration mechanism 121 may be physically located in the BIOS/UEFI 115.

Computer system 100 utilizes well known virtual addressing mechanisms that allow the programs of computer system 100 to behave as if they only have access to a large, single storage entity instead of access to multiple, smaller storage entities such as main memory 122 and DASD device 155. Therefore, while operating system 123 and data 124 are shown to reside in main memory 122, those skilled in the art will recognize that these items are not necessarily all completely contained in main memory 122 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 122. Main memory 122 stores programs and data that processor 110 may access. When computer system 100 starts up, processor 110 initially executes the program instructions that make up the basic input/output system (BIOS) 115 and later executes the program instructions that make up the operating system 123.

Although computer system 100 is shown to contain only a single processor and a single system bus, those skilled in the art will appreciate that a Vref calibration mechanism may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150, e.g. web client based users.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. In addition, many different network protocols can be used to implement a network. These protocols are specialized computer programs that allow computers to communicate across a network. TCP/IP (Transmission Control Protocol/Internet Protocol) is an example of a suitable network protocol.

In the illustrated example shown in FIG. 1, the computer system 100 includes a memory controller 120. The memory controller 120 may include a Vref calibration mechanism 121 which is adapted to execute DDR Vref training as described in further detail below. As used herein, the term Vref calibration mechanism may be used to refer the functionality described herein for the Vref calibration mechanism regardless of where it resides.

Again referring to the example in FIG. 1, the computer system 100 may include a basic input/output system (BIOS) and/or unified extensible firmware interface (UEFI) 115 as introduced above. The BIOS/UEFI 115 may include a read-only memory (ROM) and/or one or more caches. The BIOS/UEFI 115 may comprise a silicon die/chip and include software, hardware or firmware components. In other examples, the BIOS/UEFI 115 may be packaged in any silicon die package or electronic component package. In other examples, the BIOS/UEFI 115 may be programmed into an existing computer component. The BIOS/UEFI 115 may reside on a motherboard and be communicatively coupled to the processor 110 via bus connection 160, as shown in FIG. 1. The BIOS/UEFI 115 may include a CPU interface associated with the bus connection 160. The BIOS/UEFI 115 may include the Vref calibration mechanism 121 shown in the memory controller 120.

Figure 2:
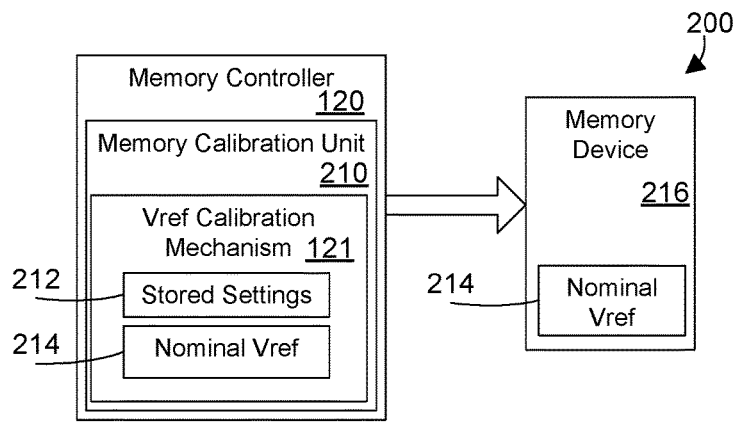
FIG. 2 is a simplified block diagram of a memory controller with a Vref calibration mechanism described herein.

FIG. 2 illustrates a simplified block diagram of a system 200 for data eye training that reduces the time and resources spent calibrating memory device 216. The memory device 216 may be a component of main memory 122 shown in FIG. 1. The system 200 may be part of the computer system 100 as described above. The system 200 includes a memory controller 120 with a memory calibration unit 210. The memory calibration unit 210 may function similar to memory calibration units known in the prior art to calibrate memory devices. The memory calibration unit performs a test by running a pre-determined combination of write and/or read commands to the memory device 216. A fail is declared when there is a discrepancy between the expected data pattern and the incoming pattern read from the memory device. The failure is assumed to be related to the timing changes that have been done internally to the memory controller for the test.

Again referring to FIG. 2, the memory calibration unit 210 in the illustrated example further includes a Vref calibration mechanism 121. The Vref calibration mechanism 121 reduces the time and resources for calibration by reducing the number of tests needed to sufficiently determine the edges and area within the boundaries of the data eye of the memory device. The Vref calibration mechanism 121 may include one or more stored settings 212 and one or more stored nominal Vref values 214. The stored settings 212 are used to change calibration parameters for a given portion of the memory device. For example, the stored settings 212 are used to set the Vref depending on the portion of the memory device being accessed similar to the manner known in the prior art. The stored nominal Vref value(s) 214 may be a value for Vref supplied by a user or from a previous test that is used by the Vref calibration mechanism to begin calibration as described further below. In some examples, the nominal Vref values 214 could be stored in the memory device and accessed by the Vref calibration mechanism 121.

Figure 3:
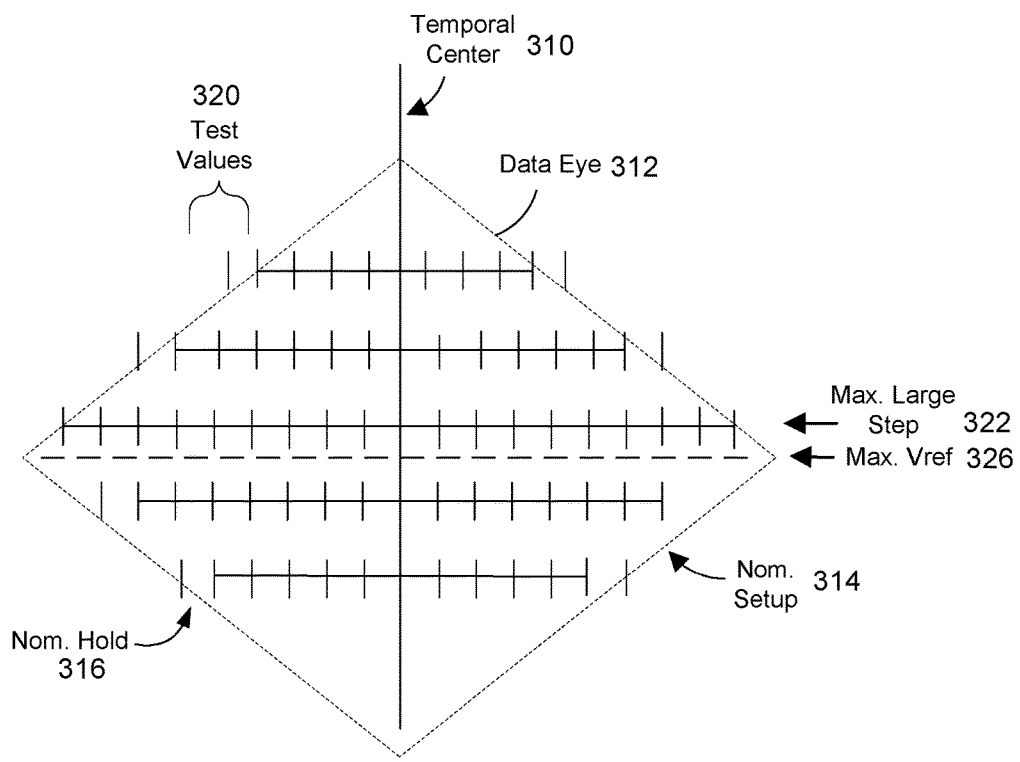
FIG. 3 illustrates a data eye of a memory device that is calibrated by the Vref calibration mechanism.

FIG. 3 is a simplified diagram of a data eye of a memory device that is calibrated by the Vref calibration mechanism 121. In FIG. 3, the horizontal axis represents different times for a timing signal such as a read data strobe (DQS) signal from a DDR SDRAM. One of ordinary skill in the art will recognize that the same diagram would similarly apply for a write data signal. The vertical axis is the temporal center 310. The values of the horizontal axis on the right represent nominal setup time 314 and the values on the left represent a nominal hold time 316 for a memory strobe signal such as the DQS signal described above. The vertical axis in FIG. 3 corresponds to various reference voltages used for a Vref signal applied to the memory device 216. Two-dimensional analysis is done to adjust and/or select the operating Vref(s) for a memory device by making tradeoffs between optimized timing and Vref voltage margins.

In FIG. 3, the data eye 312 represents a simplified view of the range of voltages and timing that can successfully access the memory device. The Vref training is done to place a memory data strobe within the data eye 312 for a given memory cycle. A Vref voltage that achieves an optimum tradeoff in the data eye 312 is stored in the stored settings 212 in FIG. 2 and used to access the memory device in a similar manner as known in the prior art. Similarly, a timing delay setting can also be stored to center the data eye in the manner known in the prior art. The shape of the data eye 312 is shown here as diamond shaped. While the real shape of a data eye is not precisely diamond shaped, it is often simplified to the diamond shape as shown for illustration purposes.

Again referring to FIG. 3, the Vref calibration mechanism 121 reduces the time and resources for calibration of the memory device by reducing the number of tests needed to sufficiently determine the edges and area of the data eye 312 for the memory device 216. In FIG. 3, each small vertical line at each level of Vref represents a test value 320. For each test value shown with a vertical line, the corresponding Vref and timing are used to test the memory device. If the test results in good data, then the location of the test value can be considered to be within the data eye 312. Tests are typically run at each interval along each Vref to determine the area of the data eye 312. The shape of the data eye can then be determined as illustrated in FIG. 3. As described herein, the Vref calibration mechanism 121 reduces the time and resources for calibration of the memory device by reducing the number of tests needed to determine the boundaries of the data eye 312. Tests are eliminated by reducing the number of voltage levels tested as described in the various examples herein.

Figure 4:
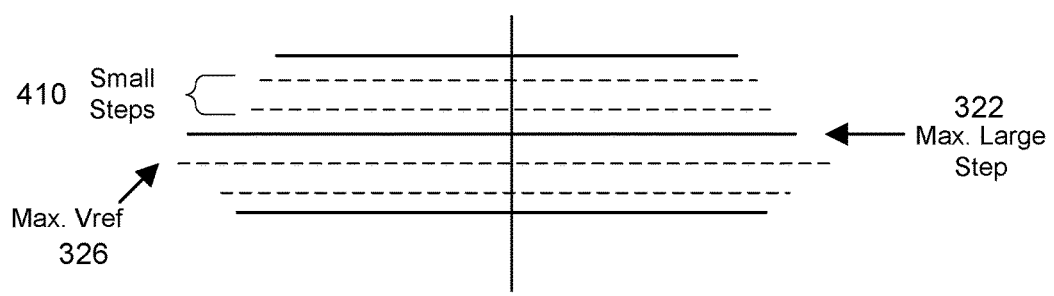
FIG. 4 illustrates small steps and small steps of the reference voltage to identify the data eye of a memory device.

The Vref calibration mechanism 121 reduces the number of tests needed to sufficiently determine the edges and area of the data eye 312 for the memory device 216 by using a combination of big steps and small steps in the Vref to more efficiently identify a maximum Vref. In a first example as shown in FIG. 3, the Vref calibration mechanism 121 makes several calibration test runs at big steps in the Vref. As used herein, big steps or making big steps means to make calibration tests in relatively large increments of the Vref voltage range applied to the memory device. An example of big steps is about 5% of the Vref range and small steps about 1% of the Vref range. Alternatively, the small steps could be about 0.5% of the Vref range. Other step sizes could be determined for a specific implementation. In the example shown in FIG. 3, the Vref calibration mechanism 121 makes calibration tests at five large step Vrefs. The large step Vref 322 is found to have the greatest eye width. The Vref calibration mechanism 121 can then determine that the maximum Vref 326 most likely falls on either side of this voltage. The Vref calibration mechanism 121 then makes tests with small steps 410 in the Vref as shown in FIG. 4. In this example, the Vref calibration mechanism 121 has found the maximum Vref 326 one small step below the maximum large step Vref 322 found previously as shown in FIG. 3. The Vref calibration mechanism 121 then selects this maximum Vref 326 to use at runtime. In addition, the Vref calibration mechanism 121 may store the best case delay setting for this final maximum Vref 326. The delay setting may be loaded from memory for the previously run calibration tests, or if they are not available, the Vref calibration mechanism 121 can do a complete set of tests for this final Vref to obtain the delay settings to store in the stored settings 212 in FIG. 2 to be used during runtime in the manner known in the prior art.

Figure 5A:
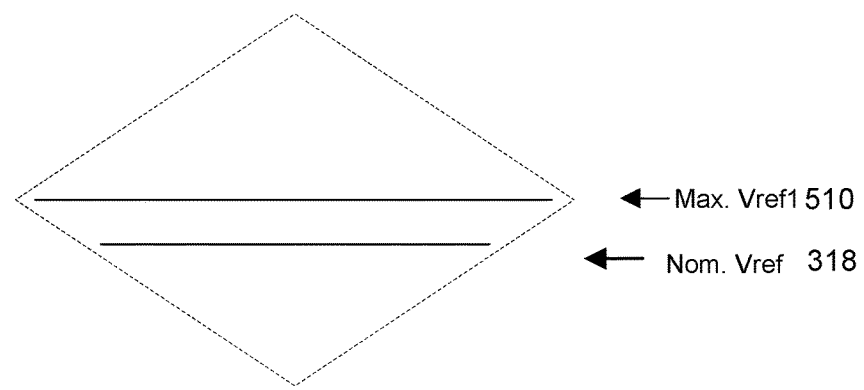
FIGS. 5A-5C illustrate three possible locations of the maximum Vref and the Nominal Vref in the data eye of a memory device.
Figure 5B:
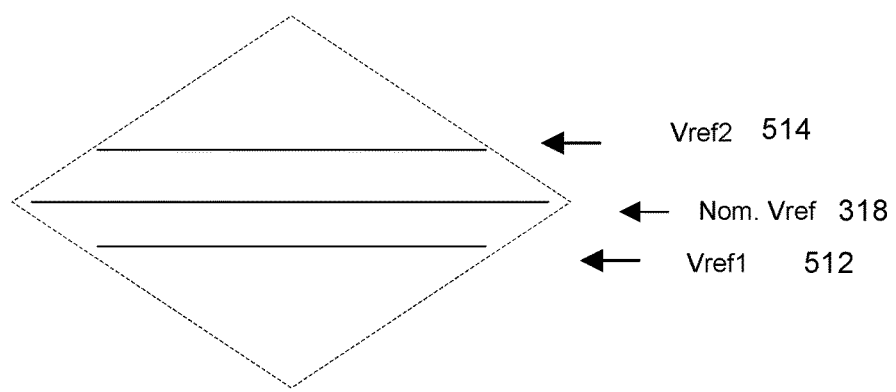
Figure 5C:
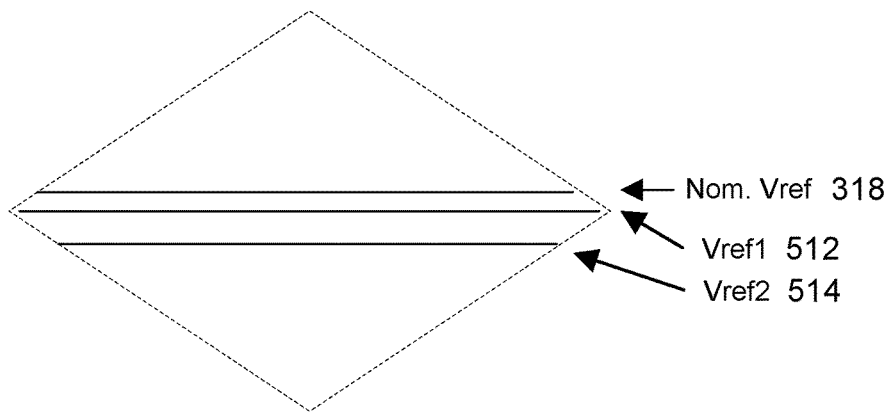

Additional tests may be eliminated by using a nominal Vref 214 as shown in FIG. 2. The nominal Vref 214 may be provided by a user or may be saved from a previous calibration cycle as described further below. The Vref calibration mechanism 121 may reduce the number of tests to determine the data eye by dividing the calibration tests into at least two regions with one on either side of the nominal Vref. If the maximum eye width is found on the first region then the Vref calibration mechanism does not need to search the other region as described below. FIG. 5 illustrates the various situations of where the nominal Vref may be found with respect to the maximum Vref of the data eye. FIG. 5A illustrates the situation where the nominal Vref 318 lies below a maximum Vref1 510. FIG. 5B illustrates the situation where the nominal Vref 318 lies at the maximum Vref. At either side of the nominal Vref 318, at a big step in Vref above and below, are Vref1 512 and Vref2 514. Vref1 512 is less than the nominal Vref318 while Vref2 514 is greater than the nominal Vref 318. FIG. 5C illustrates the situation where the nominal Vref318 lies above the maximum Vref1 512. A smaller width is found one big step below the maximum at Vref2 514.

In a second example, the Vref calibration mechanism 121 reduces the number of tests needed to sufficiently determine the edges and area of the data eye 312 for the memory device 216 using a nominal Vref and dividing range of the data eye into two regions. The Vref calibration mechanism 121 then uses a combination of big steps and small steps of the Vref in the two regions to identify the maximum Vref as described in more detail below. The Vref calibration mechanism 121 may first check for a passing range to insure that the selected Vref is within the data eye. The Vref calibration mechanism then big steps in a first region to find a big step maximum or a decrease in the data eye width. If a big step maximum or decrease is found then the Vref calibration mechanism small steps to find a maximum. If no increase in the data eye width is found while searching for a maximum, then the maximum is not in the first region and the Vref calibration mechanism 121 must continue in the second region on the other side of the nominal Vref. If an increase is found, then the maximum Vref must lie in the first region. The Vref calibration mechanism 121 selects the maximum Vref to use at runtime and stores the delay settings associated with the maximum Vref in the manner known in the prior art.

In the second example, the Vref calibration mechanism 121 reduces the number of tests needed to sufficiently determine the edges and area of the data eye 312 by dividing range of the data eye into two regions. Inside the two regions, the Vref calibration mechanism 121 big steps the Vref to find a maximum or a decrease in the eye width and then begins small stepping to more accurately find the Vref maximum. With each test run of a big step in the Vref, there are four possible outcomes, namely: a failure, an increase, a decrease or the same width. The Vref calibration mechanism determines an appropriate big step reference voltage level to start small stepping to find a maximum Vref. If there is a failure then the Vref calibration mechanism 121 checks if there was a previous pass. If there was previous pass then the Vref calibration mechanism big steps to the next big step Vref and runs tests again. If there was a previous pass then the maximum is between this Vref and the previous Vref so the Vref calibration mechanism steps back one step. If there is an increase then the Vref calibration mechanism 121 checks if the next step is in the maximum range. If the next step is within the maximum range then the Vref calibration mechanism 121 big steps to the next Vref and tests again at the new Vref. If the next step is not within the maximum range then the maximum is between this Vref and the maximum range, so the Vref calibration mechanism 121 steps back one step. If there is a decrease then the Vref calibration mechanism 121 checks if there was a previous increase. If there was no previous increase then the Vref calibration mechanism 121 uses this Vref to continue with small steps. If there was a previous increase then the maximum is on either side of the previous Vref so the Vref calibration mechanism 121 steps back two big steps and continues with small steps. If there was no failure, no increase and no decrease, then the eye width was the same so the maximum is between the current Vref and the previous Vref. In this case, the Vref calibration mechanism 121 steps back one big step before continuing with small steps.

The nominal Vref 214 described above may be provided from a previous calibration cycle and saved by the Vref calibration mechanism 121 as shown in FIG. 2. The nominal Vref may be saved in any location available to the Vref calibration mechanism 121. Alternatively, the nominal Vref 214 may be supplied by a user. As described above, the Vref calibration mechanism 121 may reduce tests needed to find the maximum data eye width by first testing in a first region, in this example the first region is above the nominal Vref. If the maximum is found in the first region then the number of tests is significantly reduced since the second region does not need to be tested. The user can select a nominal Vref near or just below where the maximum is likely to be to found thus increasing the odds that the maximum will be found in the first region and thereby reducing the time needed to find the maximum. For example, if the user knows that the maximum Vref typically falls at about 60% of the Vref range, then the user can select the nominal Vref to begin at about 55% of the Vref range. With this selection, there is a high probability that the maximum Vref will be found in the first region and with a minimum number of big steps of the Vref.

Figure 6:
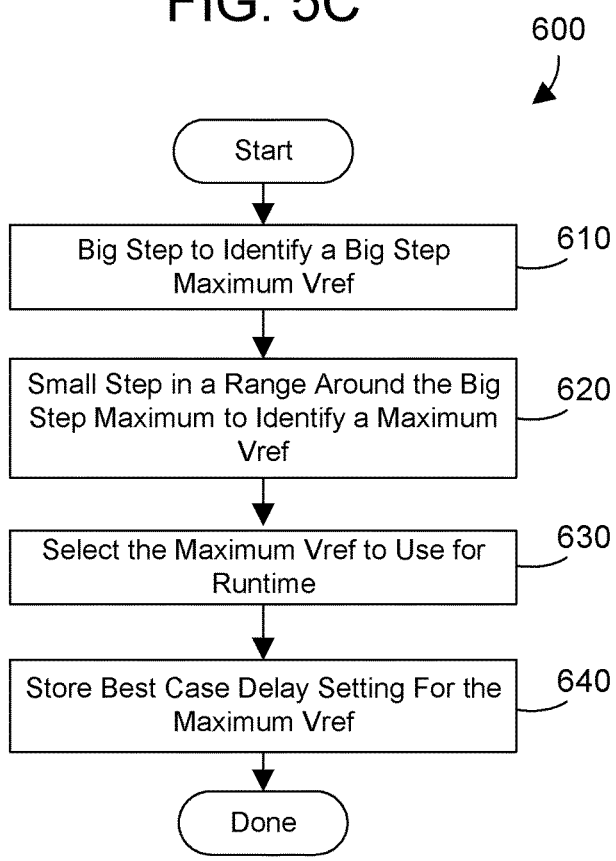
FIG. 6 is a flow diagram of a method for a system for a Vref calibration mechanism to calibrate a memory device.

Referring to FIG. 6, a method 600 shows one suitable example for data eye training that reduces the time and resources spent calibrating a memory device. Portions of method 600 are preferably performed by the Vref calibration mechanism 121 described above and shown in FIGS. 1 and 2. First, determine the data eye by making calibration tests at a number of big steps in the Vref to identify a big step maximum Vref (step 610). Then, make small steps in the Vref in a range around the big step maximum to identify a maximum Vref (step 620). Select the maximum Vref for use at runtime (step 630). Store the best case setting for the maximum Vref (step 640) and the method 600 is then done.

Referring to FIG. 7, a method 700 shows another suitable example for data eye training that reduces the time and resources spent calibrating a memory device. Portions of method 700 are preferably performed by the Vref calibration mechanism 121 described above and shown in FIGS. 1 and 2. First, check for a passing range (step 710). Then, determine the data eye by testing at a number of big steps in a first range until a big step maximum or a decrease in eye width is found (step 720). Then, make small steps in the Vref in a reduced range around the big step maximum to identify a maximum Vref (step 730). Determine if an increase if found (step 740). If an increase is found (step 740=yes) then go to step 770. If no increase is found (step 740=no) then big step in a second range until a maximum Vref or decrease in eye width is found (step 750). Then make small steps in the Vref in a range around the big step maximum to identify a maximum Vref (step 760). Then select the maximum Vref for use at runtime (step 770). Store the best case setting for the maximum Vref (step 780) and the method 700 is then done.

FIG. 8 shows one suitable example of a method 800 for making big steps to determine a maximum eye width. Method 800 thus shows a suitable method for performing steps 720 and 750 in method 700. First, run tests at a big step Vref (step 810). The tests should give one of four possible outcomes, namely: a failure, an increase, a decrease or the same eye width. If there is a failure (step 815=yes) then check if there was a previous pass (step 820). If there was no previous pass (step 820=no) then big step to the next Vref (step 825) and return to step 810 to run the tests again at the new Vref. If there was a previous pass (step 820=yes) then the maximum is between this Vref and the previous Vref so step back one step (step 850). The method 800 is then done and the flow returns to method 700. If there is no failure (step 815=no) and if there is an increase (step 830=yes) then check if the next step is in the maximum range (step 835). If the next step is within the maximum range (step 835=no) then big step to the next Vref (step 825) and return to step 810 and run the tests again at the new Vref. If the next step is not within the maximum range (step 835=yes) then the maximum is between this Vref and the maximum range, so step back one step and the method 800 is done. If there is no increase (step 830=no) and if there is a decrease (step 845=yes) then check if there was a previous increase (step 855). If there was no previous increase (step 835=no) then use this Vref to continue in method 700 to step back to the nominal Vref with small steps (step 865). If there was a previous increase (step 835=yes) then the maximum is on either side of the previous Vref so step back two big steps (step 860) and the method 800 is done. If there was no failure (step 815=no), no increase (step 830=no) and no decrease (step 845=no) then the eye width was the same so the maximum is between this Vref and the previous Vref so step back one step (step 850). The method 800 is then done and the flow returns to method 700.

FIG. 9 shows one suitable example of a method 900 for making small steps to determine a maximum eye width. Method 800 thus shows a suitable method for performing steps 730 and 760 in method 700. Set a starting Vref for small steps depending on the big steps previously tested (step 910). Make a small step in a range near the big step maximum and test (step 920). If the maximum is not found (step 930=no) then check if the Vref is out of range (step 940). If the Vref is not out of range (step 940=no) then return to step 920. If the Vref is out of range (step 940=yes) then set the current Vref to the maximum Vref (step 950). If the maximum is found (step 930=yes) then set the current Vref to the maximum (step 950). The method 900 is then done.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The disclosure and claims herein relate to a system for data eye training that reduces the time and resources spent calibrating one or more memory devices. A Vref calibration mechanism reduces the time and resources for calibration by reducing the number tests needed to sufficiently determine the meets and bounds of the data eye of the memory device using a combination of big steps and small steps of the reference voltage.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A method for calibrating a reference voltage for a memory device to determine a data eye for a data strobe signal, the method comprising:
   making big steps in the reference voltage from a nominal voltage to identify a big step maximum;
   making small steps in the reference voltage in a range around the big step maximum to identify a maximum Vref that when applied to the memory device provides a maximum data eye width for the data strobe signal; and
   wherein a big step is about five percent of a reference voltage range that can be applied to the memory device, and a small step is smaller than the big step.

2. The method of claim 1 wherein the method is performed by a memory controller that controls the memory device.

3. The method of claim 1 wherein the method is performed by a basic input/output system (BIOS) that controls the memory device.

4. The method of claim 1 wherein the method is performed by a unified extensible firmware interface (UEFI) that controls the memory device.

5. The method of claim 1 further comprising:
   making big steps in the reference voltage in a first range until the big step maximum or a decrease in a width of the data eye is found;
   making small steps in a reduced range around the big step maximum or decrease in eye width to identify a maximum Vref that when applied to the memory device provides a maximum data eye width for the data strobe signal;
   when no increase in the reference voltage in the first range is found, making big steps in a second range until a big step maximum or a decrease in a width of the data eye is found, and
   making small steps in a reduced range around the big step maximum or decrease in eye width to identify a maximum Vref that when applied to the memory device provides a maximum data eye width for the data strobe signal.

6. The method of claim 5 further comprising:
   while running tests at the big steps of the reference voltage levels, determining one of the following to identify an appropriate big step reference voltage level to start small stepping: a failure, an increase, a decrease and the same data eye width.

7. The method of claim 1 further comprising selecting a maximum Vref to use for runtime.

8. The method of claim 1 further comprising storing best case delay settings for the maximum Vref.

9. The method of claim 1 further comprising running a test to check for a passing range.

10. A method for calibrating a reference voltage for a memory device to determine a data eye for a data strobe signal, the method comprising:
    making big steps in the reference voltage from a nominal voltage to identify a big step maximum in a first range until a big step maximum or a decrease in a width of the data eye is found;
    making small steps in a reduced range around the big step maximum or decrease in eye width to identify a maximum Vref that when applied to the memory device provides a maximum data eye width for the data strobe signal;
    when no increase is found for the reference voltage level in the first range, making big steps in a second range until a big step maximum or a decrease in a width of the data eye is found;
    making small steps in a reduced range around the big step maximum or decrease in eye width to identify a maximum Vref that when applied to the memory device provides a maximum data eye width for the data strobe signal;
    while running tests at the big steps of the reference voltage levels, determining one of the following to identify an appropriate big step reference voltage level to start small stepping: a failure, an increase, a decrease and the same data eye width; and
    wherein a big step is about five percent of a reference voltage range that can be applied to the memory device, and a small step is smaller than the big step.

11. The method of claim 10 further comprising:
    selecting the maximum Vref to use for runtime; and
    storing best case delay settings for the maximum Vref.

12. The method of claim 10 wherein the method is performed by a memory controller that controls the memory device.

13. The method of claim 1 wherein the small step is about one percent of the reference voltage.

14. The method of claim 10 wherein the small step is about one percent of the reference voltage.

15. A method for calibrating a reference voltage for a memory device to determine a data eye for a data strobe signal, the method comprising:
    making big steps in the reference voltage from a nominal voltage to identify a big step maximum;
    making small steps in the reference voltage in a range around the big step maximum to identify a maximum Vref that when applied to the memory device provides a maximum data eye width for the data strobe signal;
    wherein big step is a percentage of reference voltage range that can be used to be applied to the memory device, and small step is smaller than the big step; and
    wherein the percentage is about five percent, and the small step is about one percent of the reference voltage range.

16. The method of claim 15 wherein the method is performed by a basic input/output system (BIOS) that controls the memory device.

17. The method of claim 15 wherein the method is performed by a unified extensible firmware interface (UEFI) that controls the memory device.

18. The method of claim 15 further comprising:
    making big steps in the reference voltage level in a first range until the big step maximum or a decrease in a width of the data eye is found;
    making small steps in a reduced range around the big step maximum or decrease in eye width to identify a maximum Vref that when applied to the memory device provides a maximum data eye width for the data strobe signal;
    when no increase in the reference voltage level in the first range is found, making big steps in a second range until a big step maximum or a decrease in a width of the data eye is found, and
    making small steps in a reduced range around the big step maximum or decrease in eye width to identify a maximum Vref that when applied to the memory device provides a maximum data eye width for the data strobe signal.

19. The method of claim 18 further comprising;
while running tests at the big steps of the reference voltage levels, determining one of the following to identify an appropriate big step reference voltage level to start small stepping: a failure, an increase, a decrease and the same data eye width.

\* \* \* \* \*